United States Patent
Kumar et al.

(10) Patent No.: US 10,963,337 B2
(45) Date of Patent: Mar. 30, 2021

(54) MEMORY SYSTEM WITH SUPER CHIP-KILL RECOVERY AND METHOD OF OPERATING SUCH MEMORY SYSTEM

(71) Applicant: SK hynix Inc., Gyeonggi-do (KR)

(72) Inventors: Naveen Kumar, San Jose, CA (US); Aman Bhatia, San Jose, CA (US); Yu Cai, San Jose, CA (US); Chenrong Xiong, Fremont, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/238,370

(22) Filed: Jan. 2, 2019

(65) Prior Publication Data

US 2019/0213072 A1    Jul. 11, 2019

Related U.S. Application Data

(60) Provisional application No. 62/614,839, filed on Jan. 8, 2018.

(51) Int. Cl.
| | |
|---|---|
| *G06F 11/10* | (2006.01) |
| *H03M 13/11* | (2006.01) |
| *H03M 13/29* | (2006.01) |
| *G11C 29/42* | (2006.01) |
| *G11C 29/52* | (2006.01) |

(Continued)

(52) U.S. Cl.
CPC ...... *G06F 11/1068* (2013.01); *G06F 11/1004* (2013.01); *G06F 11/1012* (2013.01); *G11C 29/42* (2013.01); *G11C 29/52* (2013.01); *H03M 13/1102* (2013.01); *H03M 13/1108* (2013.01); *H03M 13/155* (2013.01); *H03M 13/2927* (2013.01); *H03M 13/618* (2013.01); *G11C 2029/0411* (2013.01)

(58) Field of Classification Search
CPC ............ G06F 11/1068; G06F 11/1004; G06F 11/1012; H03M 13/1102; H03M 13/618; H03M 13/2927; H03M 13/1108; H03M 13/155; H03M 13/13; H03M 13/458; H03M 13/45; H03M 13/1111; H03M 13/1191; H03M 13/3707; H03M 13/6502; H03M 13/611; G11C 29/42; G11C 29/52; G11C 2029/0411
USPC ......................................................... 714/758
See application file for complete search history.

(56) References Cited

U.S. PATENT DOCUMENTS

| | | | | |
|---|---|---|---|---|
| 7,644,339 B2 * | 1/2010 | Tran | ..................... | H03M 13/616 714/758 |
| 8,443,255 B2 * | 5/2013 | Jiang | ...................... | H04L 1/005 714/758 |

(Continued)

*Primary Examiner* — Albert Decady
*Assistant Examiner* — Enam Ahmed
(74) *Attorney, Agent, or Firm* — IP & T Group LLP (57) ABSTRACT

Devices and methods that generate code on chip-kill parity in which the code is generated and shortened using variable node degree information for improved decoding of data. In one aspect, memory controller comprises an encoder configured to construct a first code of D data bits and P parity bits, determine the number of distinct variable degree nodes L and the number of data bits of each of the variable degree nodes in the first code, and construct a second code that is shorter than the first code based on the determined number of variable degree nodes and the number of data bits of each of the variable degree nodes in the first code.

15 Claims, 7 Drawing Sheets

(51) Int. Cl.
*H03M 13/15* (2006.01)
*H03M 13/00* (2006.01)
G11C 29/04 (2006.01)

(56) References Cited

U.S. PATENT DOCUMENTS

| | | | |
|---|---|---|---|
| 8,566,667 B2* | 10/2013 | Hu | G06F 11/1012 |
| | | | 714/752 |
| 2008/0288846 A1 | 11/2008 | Kyung et al. | |
| 2009/0013239 A1* | 1/2009 | Blanksby | H03M 13/1111 |
| | | | 714/801 |
| 2015/0128005 A1* | 5/2015 | Jeong | H03M 13/036 |
| | | | 714/752 |
| 2015/0372694 A1* | 12/2015 | Myung | H03M 13/036 |
| | | | 714/752 |
| 2016/0306694 A1 | 10/2016 | Tai et al. | |
| 2016/0350184 A1* | 12/2016 | Varanasi | G06F 11/1072 |
| 2019/0140661 A1* | 5/2019 | Calabr | H03M 13/1137 |
| 2019/0155686 A1 | 5/2019 | Kumar et al. | |

\* cited by examiner

MEMORY SYSTEM WITH SUPER CHIP-KILL RECOVERY AND METHOD OF OPERATING SUCH MEMORY SYSTEM

CROSS-REFERENCE TO RELATED APPLICATION

This application claims the benefit of U.S. Provisional Application No. 62/614,839, filed Jan. 8, 2018, the entire contents of which are incorporated herein by reference.

BACKGROUND

1. Field

Embodiments of the present disclosure relate to a memory system with a scheme to generate chip-kill parity, and method of operating such memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

A flash memory, e.g., of the NAND-type, may apply any of various error correction codes to correct errors in data. One such error correction code is low-density parity-check code (LDPC), which is an advanced error code that is used to recover a relatively large number of errors in data. In this context embodiments of the present invention arise.

SUMMARY

Aspects of the present invention include memory systems and components thereof such as memory controllers. In one aspect, a memory controller, comprises an encoder configured to construct a first code of D data bits and P parity bits, determine the number of distinct variable degree nodes L and the number of data bits of each of the variable degree nodes in the first code, and construct a second code that is shorter than the first code based on the determined number of variable degree nodes and the number of data bits of each of the variable degree nodes in the first code.

Further aspects of the present invention include methods, particularly methods of operating memory systems and components thereof such as memory controllers. In one aspect, a method of operating a memory controller comprises constructing a first code of D data bits and P parity bits; decoding each word line in a superblock using a first code of D data bits and P parity bits; identifying each word line for which decoding with the first code failed (failed word line); determining the number of distinct variable degree nodes L and the number of data bits of each of the variable degree nodes in the first code; constructing a second code that is shorter than the first code based on the determined number of variable degree nodes and the number of data bits of each of the variable degree nodes in the first code; and decoding each failed word line using the second code.

In still another aspect of the present invention, a memory controller comprises an encoder and a decoder. The encoder constructs a first code of D data bits and P parity bits, and construct a second code that is shorter than the first code based on the determined number of variable degree nodes and the number of data bits of each of the variable degree nodes in the first code. The decoder decodes each word line in a superblock using the first code, identifies each word line for which decoding with the first code failed (failed word line), and decodes each failed word line using the second code.

Additional aspects of the present invention will become apparent from the following description.

DETAILED DESCRIPTION

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrases are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

Figure 1:
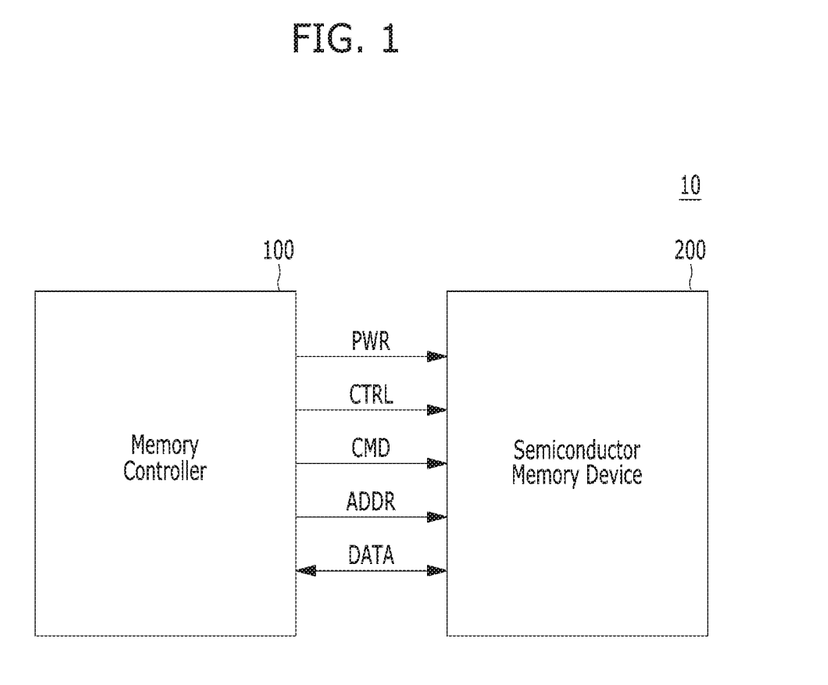
FIG. 1 is a block diagram illustrating a memory system in accordance with an embodiment of the present invention.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a powerline and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
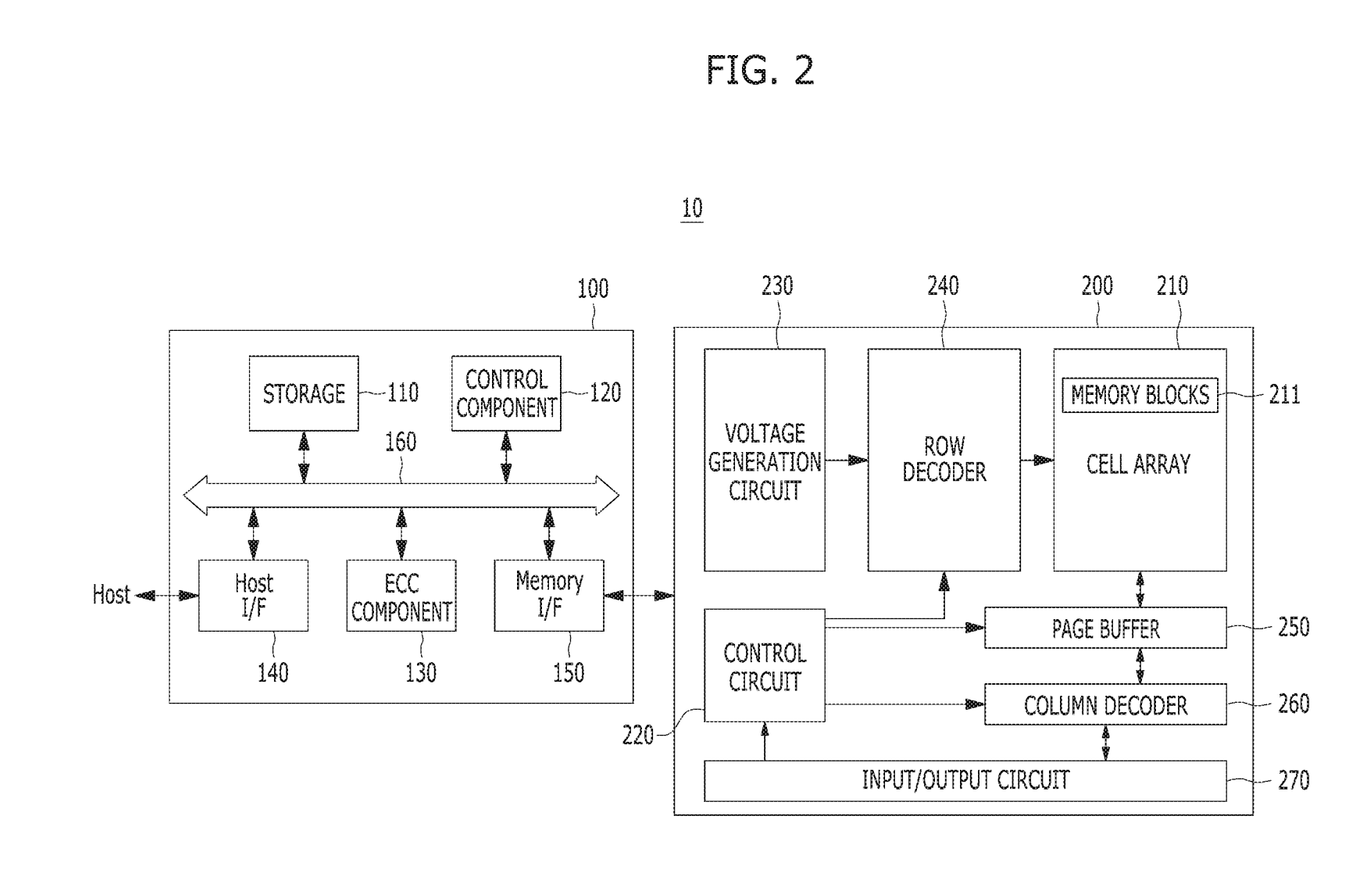
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In some embodiments, the ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a block coded modulation (BCM). As such, the ECC component 130 may include all circuits, systems or devices for suitable error correction operation. In particular, the ECC component 130 may include an encoder and an LDPC decoder, e.g., a single LDPC chip-kill decoder. As explained in more detail below, the encoder/decoder assembly generate code on chip-kill parity in which the code is judicially generated and shortened using variable node degree information.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADA generated by the control circuit 220, and transmit operation voltages supplied from the voltage generation circuit 230 to the selected memory blocks.

Figure 3:
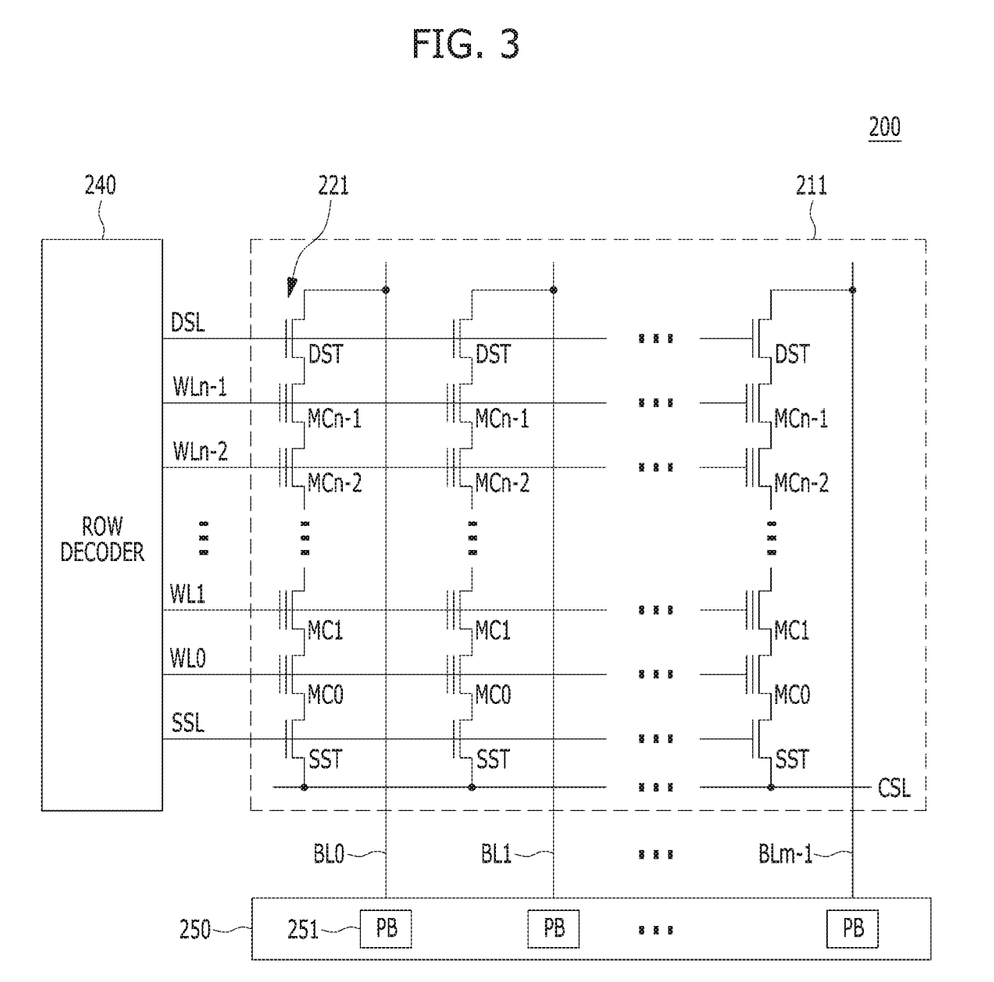
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to 1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
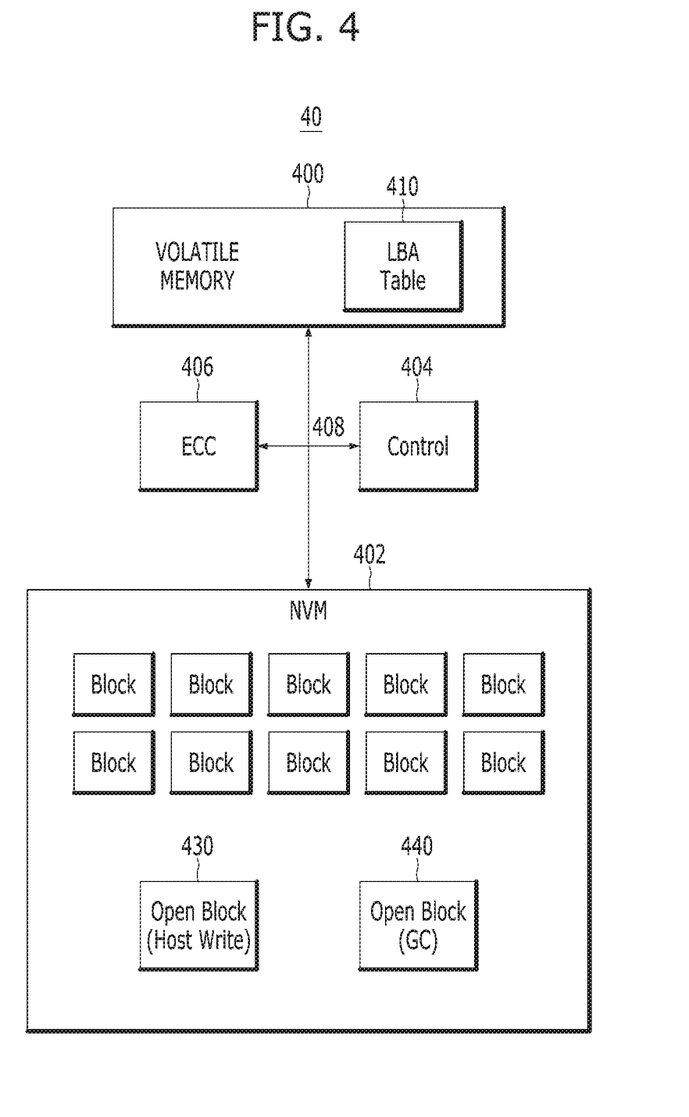
FIG. 4 is a schematic diagram of a memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address LBA table 410 for mapping physical-to-logical addresses of bits. The NVM 402 may include a plurality of memory blocks (and/or a plurality of super memory blocks), as well as an open block for host writes 430 and an open block for garbage collection (GC) 440. Multiple memory blocks may be grouped together as a superblock for certain functional purposes. FIG. 4 shows a general memory system. Additional/alternative components that may be utilized with memory systems to effectuate the present invention will be understood to those of skill in the art in light of this disclosure.

Aspects of the present invention are directed to an error recovery scheme involving chip-kill parity. The chip-kill parity may not be stored; instead a parity on chip-kill parity may be stored on the last word line of a superblock. Generating a code in this way can provide significant correction capability gain.

Embodiments of the present invention provide further improvements to shorten the code length for the chip-kill parity, reduce the system-on-chip (SoC) area for the LDPC decoder, and lower associated power consumption. In an embodiment, a code-length shortening algorithm with a hardware-friendly implementation is provided. In an embodiment, generating code on chip-kill parity is carried out by constructing codes judiciously, using variable node degree information. Moreover, code shortening may advantageously avoid a multiple LDPC decoder hardware implementation.

In general, an irregular LDPC code can provide better correction capability than a regular LDPC code. However, variable bits with lower degree have higher probability of getting stuck during decoding compared to higher degree variable bits. In an embodiment, this information is exploited to generate a chip-kill code with varying code lengths. Variable bits with lower degree should have stronger LDPC chip-kill code capability, and variable bits with higher degree should have weaker LDPC chip-kill code capability. In an embodiment, a code shortening method is employed that enables use of a single LDPC chip-kill decoder for decoding all variable length codes.

In describing embodiments of the present invention, the following notations are used.

D denotes the number of data bits and P denote the number of parity bits for each page in a word line. D+P is the code length of LDPC code. All word lines in a superblock are encoded with same LDPC code.

L denotes the number of distinct degree variable nodes present in the LDPC code. For example, L is equal to 3 in the event that degrees 2, 4 and 10 are used for constructing the LDPC code.

$D_{k_1}$ denotes the number of data bits having degree $k_1$ variable nodes.

Accordingly, the number of data bits can be written as the sum of all degree nodes as, $D=\sum_{i=1}^{L} D_{k_i}$.

In an embodiment, during LDPC code construction, the following assumption or constraint is enforced:

$$D_{k_1} \leq D_{k_2} \leq \ldots \leq D_{k_L} \text{ where } k_1 \leq k_2 \leq \ldots k_L \quad (1)$$

While the above assumption (1) is applied in providing a solution for generating chip-kill parity in an embodiment, in another embodiment, a more general construction for the chip-kill parity, without assumption (1), is used. It is important to note that assumption (1) is not always true.

To construct another code, e.g., an LDPC2 code, XOR of all $D_{k_1}$ bits across all word lines in a superblock is computed, and the LDPC2 code is constructed using $$\frac{D+P}{L}$$

parity bits and $(D_{k_L} - D_{k_1})$ shortening bits. Similarly, XOR of all $D_{k_2}$ bits across all word lines in a superblock is computed and LDPC2 code is used for construction with $$\frac{D+P}{L}$$

parity bits and $(D_{k_L}-D_{k_2})$ shortening bits. This is done for all degree variable nodes, and the last construction has zero shortening.

The advantages of this construction are twofold. First, there is a single LDPC2 code is used of constant length $$\left(D_{K_L} + \frac{D+P}{L}\right)$$

for all L codes that is of much shorter length compared to prior constructions, which leads to smaller SoC area. Second, shortening is variable across all codes that gives variable correction capability. Larger degree variable nodes are protected relatively less using less shortening of the code whereas smaller degree variable nodes are strongly protected by using more shortening of the code.

Constructing such codes in the super-kill chip recovery decoding scheme may be performed by an encoder in the ECC component 130 of FIG. 2 or the ECC module 406 of FIG. 4. The decoding in the super-kill chip recovery decoding scheme may be performed by an LDPC decoder, which may be embodied in the ECC component/module 130 or 406. Other suitable component(s) within the memory system 10 or 40, e.g., control component 120 or control logic 404 also may be used to assist in certain aspects of the processing.

Figure 5:
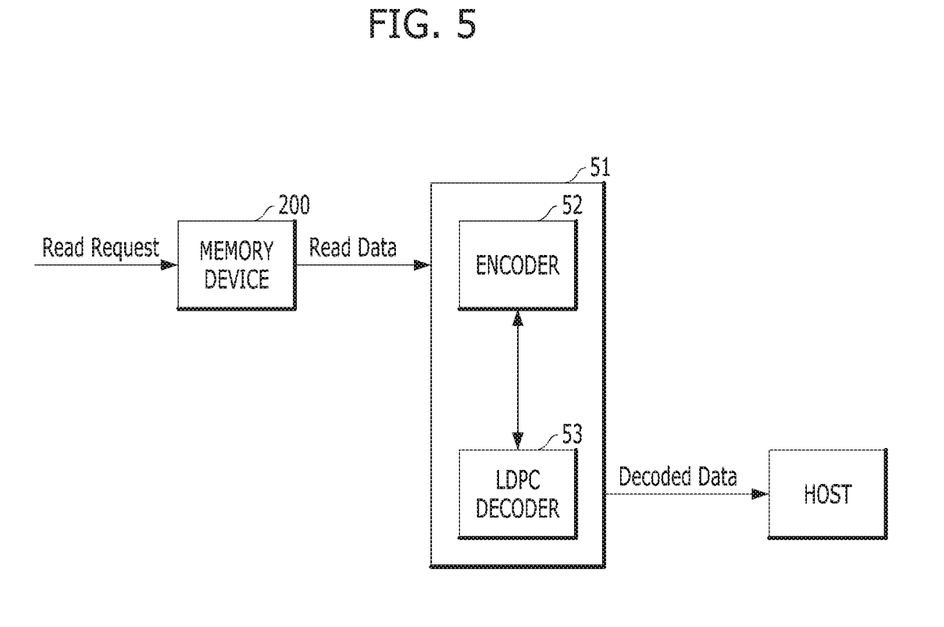
FIG. 5 is a schematic diagram showing components in the context of an overall flow of the code construction, code shortening and decoding processes in accordance with an embodiment of the present invention.

FIG. 5 shows an ECC component 51, which includes both an encoder 52 and an LDPC decoder 53, in the context of an overall flow of the code construction, code shortening and decoding process. All such components may be embodied in a memory controller, e.g., memory controller 100 of FIG. 2.

Initially, a read request is issued, e.g., by a host, which request is transmitted, via the memory controller 100, to the memory device 200. In response to the read request, data, e.g., codewords, are read from the memory device 200. Code construction and code shortening operations are then performed on such data as described above. The constructed and shortened codes are then input to the LDPC decoder 51 as described herein. Decoded data is then output, e.g., to the host where the read request originated.

Figure 6:
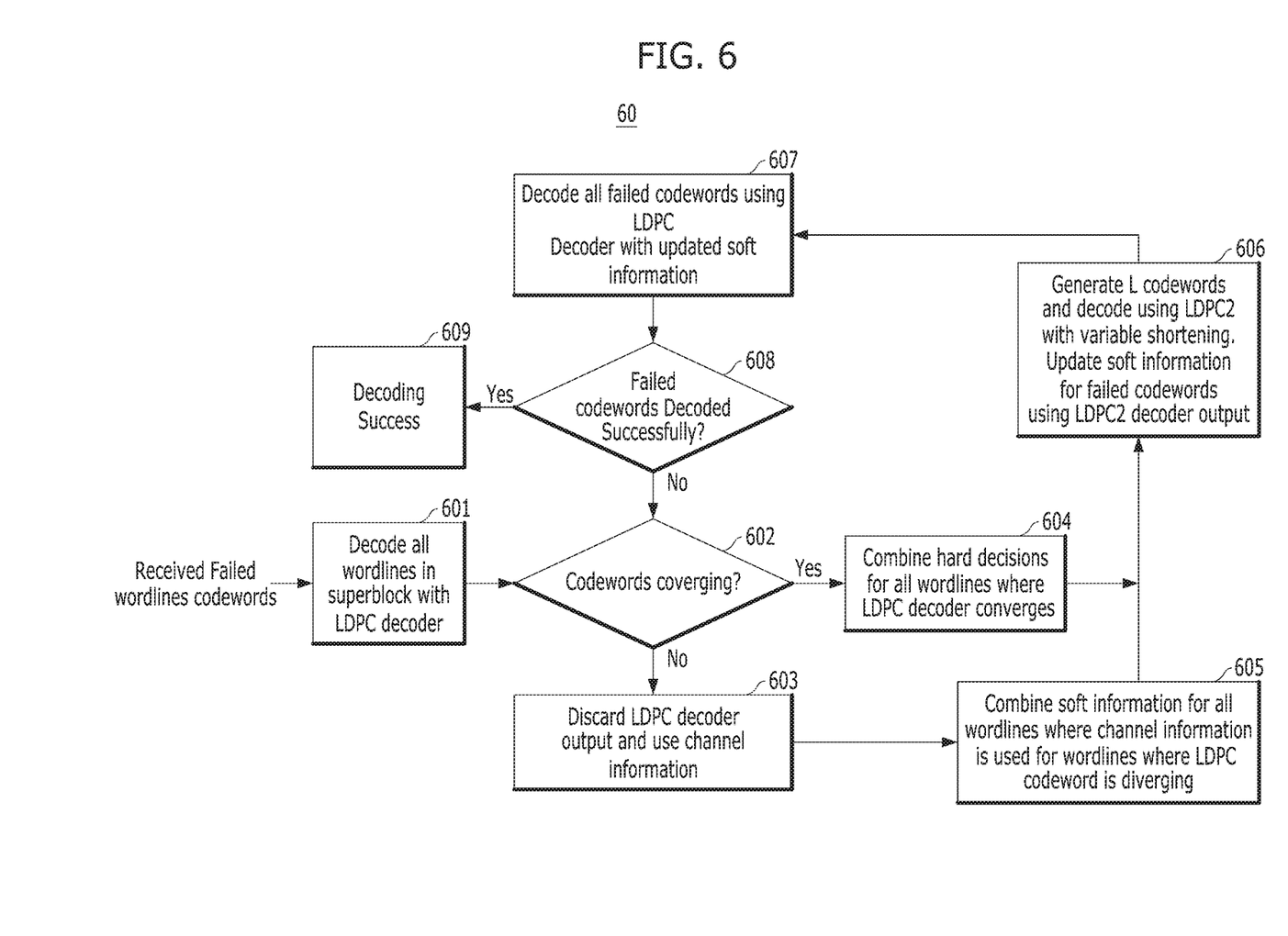
FIG. 6 is a flow chart of the decoding scheme for super chip-kill recovery in accordance with an embodiment of the present invention.

A flow chart 60 of the decoding scheme for super chip-kill recovery is shown in FIG. 6. The decoding may be performed by the LDPC decoder 53 alone or in conjunction with other components of the memory controller 100.

Referring to FIG. 6, in conjunction with other figures, at step 601 of the decoding scheme 60, the LDPC decoder 53 receives codewords of all word lines that were not successfully decoded in a previous iteration. At step 602, it is determined whether the codewords are converging. If not (No at step 602), the output of the LDPC decoder 53 is discarded and channel information is used (step 603). Then, all soft information for failed word lines are combined at step 605. Returning to step 602, if the decision there was 'Yes', the output of the hard decisions from the LDPC decoder 53 are collected and combined at step 604.

At step 606, L codewords are generated and decoded using constructed LDPC2 codes with variable shortening by using hard decisions from step 604 and soft information from step 605. Also, at step 606, soft information for failed codewords is updated using the LDPC2 code output. At step 607, all failed codewords are decoded using the LDPC decoder 53 with the updated soft information.

At step 608, it is determined whether the failed codewords were successfully decoded. If so (Yes at step 608), there is decoding success, as indicated at step 609, in which case further decoding of these codewords is unnecessary. However, further processing of the successfully decoded codewords may be performed as is known in the art. Returning to step 608, if the decision is 'No', the decoding scheme 60 returns to step 602, where it is again determined whether the codewords converge. Thus, the decoding scheme 60 continues until all of the codewords are successfully decoded.

As previously indicated, another embodiment, in which a more general construction for the chip-kill parity, without assumption (1), is provided.

If assumption (1) is not valid, the LDPC2 code can be constructed in a different way. In this case, degree variable nodes are binned into L* bins by combining and splitting variable nodes in different bins such that assumption (1) is valid after binning. Binning may be done offline such that correction capability is maximized heuristically, and an optimal value of L* chosen appropriately. It is noted that L* need not be equal to L. The Table below shows a binning example to attain assumption (1).

| Degree | Number of bits | Number of bits after binning |
|---|---|---|
| 2 | 100 | 50 (degree 2) = 50 |
| 4 | 300 | 50 (degree 2) + 50 (degree 4) = 100 |
| 8 | 40 | 150 (degree 4) = 150 |
| 12 | 60 | 100 (degree 4) + 40 (degree 8) + 60 (degree 12) = 200 |

Another aspect is that XOR chip-kill parity may be stored if a physical wordline failure occurs or is observed where all data on the word line is lost. In this scenario, the scheme uses $$\frac{P}{L}$$

parity instead or $$\frac{D+P}{L}$$

in constructing each short LDPC2 code. The decoding flow in FIG. 6 is also modified accordingly.

Figure 7:
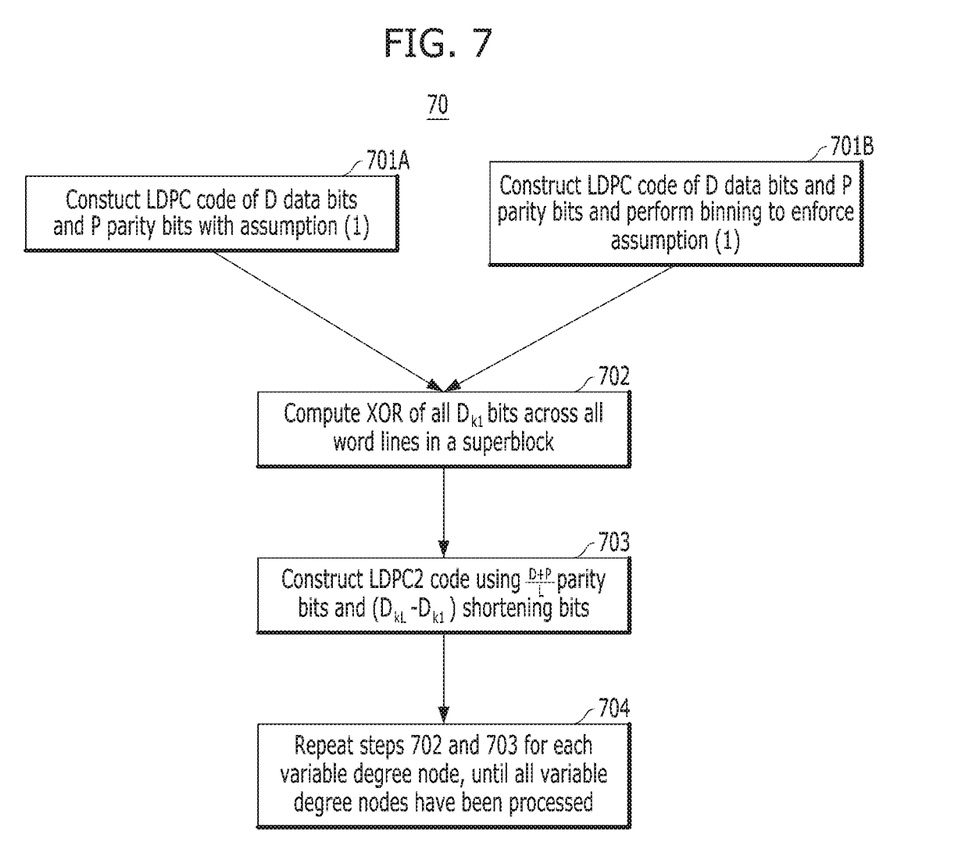
FIG. 7 is a flow chart describing steps in processes for constructing and shortening codes for chip-kill parity in accordance with embodiments of the present invention.

FIG. 7 is a flow chart describing steps in processes for constructing and shortening codes for chip-kill parity in accordance with embodiments of the present invention. The steps shown in flow chart 70 are exemplary. Those skilled in the art will understand that additional and/or alternative steps may be performed, or that the order of steps may be changed, in order to effectuate aspects of the present invention without departing from the inventive concepts disclosed herein. The steps of flow chart 70 may be performed by the memory controller 100 or suitable components thereof, as described above, any of which may be implemented with appropriate hardware, software, firmware or combination thereof. Notation previously introduced is used in the following description.

Referring to FIG. 7, at step 701A, the LDPC code of D data bits and P parity bits is constructed with assumption or constraint (1), in which the higher the variable degree node, the greater number of data bits having that degree, is imposed. If assumption (1) is not valid for the LDPC code of D data bits and P parity bits, the degree variable nodes are binned into bins by combining and splitting variable nodes in different bins such that assumption (1) is valid after binning (step 701B).

At step 702, the XOR of all $D_{k_1}$ bits across all word lines in a superblock is computed. At step 703, the LDPC2 code is constructed using $$\frac{D+P}{L}$$

parity bits and $(D_{k_L} - D_{k_1})$ shortening bits. Similarly, XOR of all $D_{k_2}$ bits across all word lines in a superblock is computed and LDPC2 code is used for construction with $$\frac{D+P}{L}$$

parity bits and $(D_{k_L} - D_{k_2})$ shortening bits. This is done for all variable degree nodes in step 704. The last construction has zero shortening.

As the foregoing demonstrates, embodiments of the present invention provide techniques for generating codes on chip-kill parity, where the codes are generated judicially using variable node degree information. The code shortening advantageously simplifies the hardware arrangement, avoiding use of multiple LDPC decoders. The code shortening and hardware-friendly implementation provides significant improvements in the construction and operation of memory systems.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory controller, comprising:
an encoder configured to:
construct a first code of D data bits and P parity bits,
determine the number of distinct variable degree nodes L and the number of data bits of each of the variable degree nodes in the first code, and
construct a second code that is shorter than the first code based on the determined number of variable degree nodes and the number of data bits of each of the variable degree nodes in the first code,
wherein when the first code does not conform to a relationship of a higher variable degree node having a greater number of bits than a lower variable degree node, the memory controller is configured to construct the second code by rearranging the data bits of the variable degree nodes into a specific number of groups to establish the relationship, the specific number of groups being selected to maximize correction capability using the second code.

2. The memory controller of claim 1, wherein in constructing the second code the memory controller is further configured to:
perform, with respect to each of the variable degree nodes in the first code, a logical operation on all of data bits of the same variable degree node across all word lines.

3. The memory controller of claim 2, wherein the second code has a constant length.

4. The memory controller of claim 3, wherein the constant length is equal to the number of data bits of the highest variable degree node plus (D+P)/L parity bits.

5. The memory controller of claim 2, wherein, in the first code the higher the variable degree node, the greater the number of bits of that variable degree node.

6. The memory controller of claim 1, wherein the rearranging comprises splitting data bits of a first variable degree node into different groups and combining data bits of a second variable node and data bits of a third variable degree node into a common group.

7. The memory controller of claim 1, wherein the number of groups is selected heuristically to maximize correction capability using the second code.

8. The memory controller of claim 1, wherein each of the first and second codes is a low-density parity-check code (LDPC) code.

9. A method of operating a memory controller, comprising:
constructing a first code of D data bits and P parity bits;
decoding each word line in a superblock using a first code of D data bits and P parity bits;
identifying each word line for which decoding with the first code failed (failed word line);
determining the number of distinct variable degree nodes L and the number of data bits of each of the variable degree nodes in the first code;
constructing a second code that is shorter than the first code based on the determined number of variable degree nodes and the number of data bits of each of the variable degree nodes in the first code, the second code being constructed so as to maximize correction capability; and
decoding each failed word line using the second code,
wherein the constructing of the first code comprises rearranging the data bits of the variable degree nodes into a specific number of groups,
wherein the rearranging comprises splitting data bits of a first variable degree node into different groups and combining data bits of a second variable node and data bits of a third variable degree node into a common group to establish a relationship in which the higher the variable degree node, the higher the bits of that variable degree node.

10. The method of claim 9, wherein the constructing of the second code comprises:
performing, with respect to each of the variable degree nodes in the first code, a logical operation on all of data bits of the same variable degree node across all word lines.

11. The method of claim 10, wherein the constructing of the second code comprises constructing the second code of a constant length that is equal to the number of data bits of the highest variable degree node plus (D+P)/L parity bits.

12. The method of claim 10, wherein the constructing of the first code comprises constructing the first code such that the higher the variable degree node, the higher the bits of that variable degree node.

13. The method of claim 9, further comprising storing XOR chip-kill parity when all data on a word line is lost.

14. The method of claim 9, wherein each of the first and second codes is a low-density parity-check code (LDPC) code.

15. A memory controller, comprising:
an encoder configured to:
construct a first code of D data bits and P parity bits,
determine the number of distinct variable degree nodes L and the number of data bits of each of the variable degree nodes in the first code, and construct a second code that is shorter than the first code based on the determined number of variable degree nodes and the number of data bits of each of the variable degree nodes in the first code, the second code being constructed so as to maximize correction capability; and a decoder configured to:

decode each word line in a superblock using the first code, identify each word line for which decoding with the first code failed (failed word line), and decode each failed word line using the second code,
wherein the constructing of the first code comprises rearranging the D data bits of the variable degree nodes into a specific number of groups, wherein the rearranging comprises splitting data bits of a first variable degree node into different groups and combining data bits of a second variable node and data bits of a third variable degree node into a common group to establish a relationship in which the higher the variable degree node, the higher the bits of that variable degree node.

\* \* \* \* \*